United States Patent
Beam, III et al.

(10) Patent No.: US 10,734,512 B2
(45) Date of Patent: Aug. 4, 2020

(54) HIGH ELECTRON MOBILITY TRANSISTOR (HEMT) DEVICE

(71) Applicant: Qorvo US, Inc., Greensboro, NC (US)

(72) Inventors: Edward A. Beam, III, Plano, TX (US); Jinqiao Xie, Allen, TX (US)

(73) Assignee: Qorvo US, Inc., Greensboro, NC (US)

( * ) Notice: Subject to any disclaimer, the term of this patent is extended or adjusted under 35 U.S.C. 154(b) by 0 days.

(21) Appl. No.: 16/383,130

(22) Filed: Apr. 12, 2019

(65) Prior Publication Data
US 2019/0237570 A1    Aug. 1, 2019

Related U.S. Application Data

(63) Continuation-in-part of application No. 15/299,571, filed on Oct. 21, 2016.
(Continued)

(51) Int. Cl.
*H01L 29/778*     (2006.01)
*H01L 29/20*      (2006.01)
(Continued)

(52) U.S. Cl.
CPC ........ *H01L 29/7786* (2013.01); *H01L 29/201* (2013.01); *H01L 29/2003* (2013.01);
(Continued)

(58) Field of Classification Search
CPC ....... H01L 29/7786; H01L 2924/13064; H01L 29/7784; H01L 29/778–7789;
(Continued)

(56) References Cited

U.S. PATENT DOCUMENTS

2005/0006639 A1*   1/2005   Dupuis ............. H01L 21/02378
                                                              257/20
2006/0255364 A1   11/2006   Saxler et al.
(Continued)

OTHER PUBLICATIONS

Cao, Yu et al., "High-mobility window for two-dimensional electron gases at ultrathin AlN/GaN heterojunctions," Applied Physics Letters, vol. 90, No. 18, May 2007, American Institute of Physics, pp. 182112-1 to 182112-3.
(Continued)

*Primary Examiner* — Changhyun Yi
(74) *Attorney, Agent, or Firm* — Withrow & Terranova, P.L.L.C.

(57) ABSTRACT

A high electron mobility transistor (HEMT) device with epitaxial layers that provide an electron Hall mobility of 1080±5% centimeters squared per volt-second ($cm^2/V·s$) at room temperature for a charge density of $3.18×10^{13}/cm^2$ and method of making the HEMT device is disclosed. The epitaxial layers include a channel layer made of gallium nitride (GaN), a first spacer layer made of aluminum nitride (AlN) that resides over the channel layer, a first spacer layer made of $Al_xGa_{(1-x)}N$ that resides over the first spacer layer, and a first barrier layer made of $Sc_yAl_zGa_{(1-y-z)}N$ that resides over the second spacer layer. In at least one embodiment, a second barrier layer made of $Al_xGa_{(1-x)}N$ is disposed over the first barrier layer.

20 Claims, 7 Drawing Sheets

Related U.S. Application Data

(60) Provisional application No. 62/320,910, filed on Apr. 11, 2016.

(51) Int. Cl.
   *H01L 29/66*      (2006.01)
   *H01L 29/201*     (2006.01)
   *H01L 29/51*      (2006.01)

(52) U.S. Cl.
   CPC .... *H01L 29/66462* (2013.01); *H01L 29/7783* (2013.01); *H01L 29/518* (2013.01)

(58) Field of Classification Search
   CPC ....... H01L 29/15–158; H01L 29/66462; H01L 29/66431; H01L 29/2003; H01L 29/7787
   See application file for complete search history.

(56) References Cited

U.S. PATENT DOCUMENTS

| | | |
|---|---|---|
| 2007/0164299 A1 | 7/2007 | Lahreche et al. |
| 2008/0124851 A1 | 5/2008 | Zhang et al. |
| 2011/0235665 A1 | 9/2011 | Simon et al. |
| 2012/0156836 A1 | 6/2012 | Shealy et al. |
| 2017/0294529 A1 | 10/2017 | Beam, III et al. |

OTHER PUBLICATIONS

Caro, Miguel A. et al., "Piezoelectric coefficients and spontaneous polarization of ScAlN," Journal of Physics: Condensed Matter, vol. 27, No. 24, May 2015, IOP Publishing, 15 pages.

Deng, Ruopeng et al., "Bandgap in Al1-xScxN," Applied Physics Letters, vol. 102, No. 11, Mar. 2013, American Institute of Physics, 112103-1 to 112103-5.

Li, Guowang et al., "Two-dimensional electron gases in strained quantum wells for AlN/GaN/AlN double heterostructure field-effect transistors on AlN," Applied Physics Letters, vol. 104, No. 19, May 2014, AIP Publishing LLC, pp. 193506-1 to 193506-5.

Moram, M. A. et al., "ScGaN and ScAlN: emerging nitride materials," Journal of Materials Chemistry A, vol. 2, 2014, The Royal Society of Chemistry, 2014, pp. 6042-6050.

Rashmi et al., "An accurate charge control model for spontaneous and piezoelectric polarization u dependent two-dimensional electron gas sheet charge density of lattice-mismatched AlGaN/GaN HEMTs," Solid-State Electronics, vol. 46, 2002, pp. 621-630.

Tasnádi, Ferenc et al., "Origin of the Anomalous Piezoelectric Response in Wurtzite ScxAl1-xN Alloys," Physical Review Letters, vol. 104, No. 13, Apr. 2010, The American Physical Society, pp. 137601-1 to 137601-4.

Tholander, et al., "Large piezoelectric response of quarternary wurtzite nitride alloys and its physical origin from first principles," Physical Review B, vol. 92, 2015, 6 pages.

Zhang, S. et al., "Elastic constants and critical thicknesses of ScGaN and ScAlN," Journal of Applied Physics, vol. 114, No. 24, Dec. 2013, AIP Publishing LLC, pp. 243516-1 to 243516-6.

Zhang, Siyuan et al., "Tunable optoelectronic and ferroelectric properties in Sc-based III-nitrides," Journal of Applied Physics, vol. 114, No. 13, Oct. 2013, AIP Publishing LLC, pp. 133510-1 to 133510-11.

Ito, Kazuya, et al., "Giant electromechanical coupling in c-axis oriented ScAlGaN films," Symposium on Ultrasonic Electronics, vol. 33, Nov. 2012, pp. 415-416.

Zukauskaite, Agne, "Metastable Pain and ScAlN thin films: growth and characterization," Licentiate Thesis No. 1524, Thin Film Physics Division, 2012, Linkoping University, Sweden, 58 pages.

Zukauskaite, Agne, et al., "Stabilization of wurtzite Sc04Al06N in pseudomorphic epitaxial ScxAl1_xN/InyAl1_yN superlattices," Acta Materialia, vol. 94, May 2015, Elsevier Ltd., pp. 101-110.

Non-Final Office Action for U.S. Appl. No. 15/299,571, dated Apr. 11, 2017, 21 pages.

Final Office Action for U.S. Appl. No. 15/299,571, dated Oct. 16, 2017, 15 pages.

Advisory Action for U.S. Appl. No. 15/299,571, dated Dec. 29, 2017, 3 pages.

Non-Final Office Action for U.S. Appl. No. 15/299,571, dated Mar. 9, 2018, 11 pages.

Final Office Action for U.S. Appl. No. 15/299,571, dated Jun. 15, 2018, 8 pages.

Advisory Action for U.S. Appl. No. 15/299,571, dated Aug. 31, 2018, 3 pages.

Non-Final Office Action for U.S. Appl. No. 15/299,571, dated Feb. 27, 2019, 8 pages.

Final Office Action for U.S. Appl. No. 15/299,571, dated Jul. 10, 2019, 11 pages.

Advisory Action for U.S. Appl. No. 15/299,571, dated Sep. 17, 2019, 3 pages.

Notice of Allowance for U.S. Appl. No. 15/299,571, dated Nov. 6, 2019, 7 pages.

\* cited by examiner

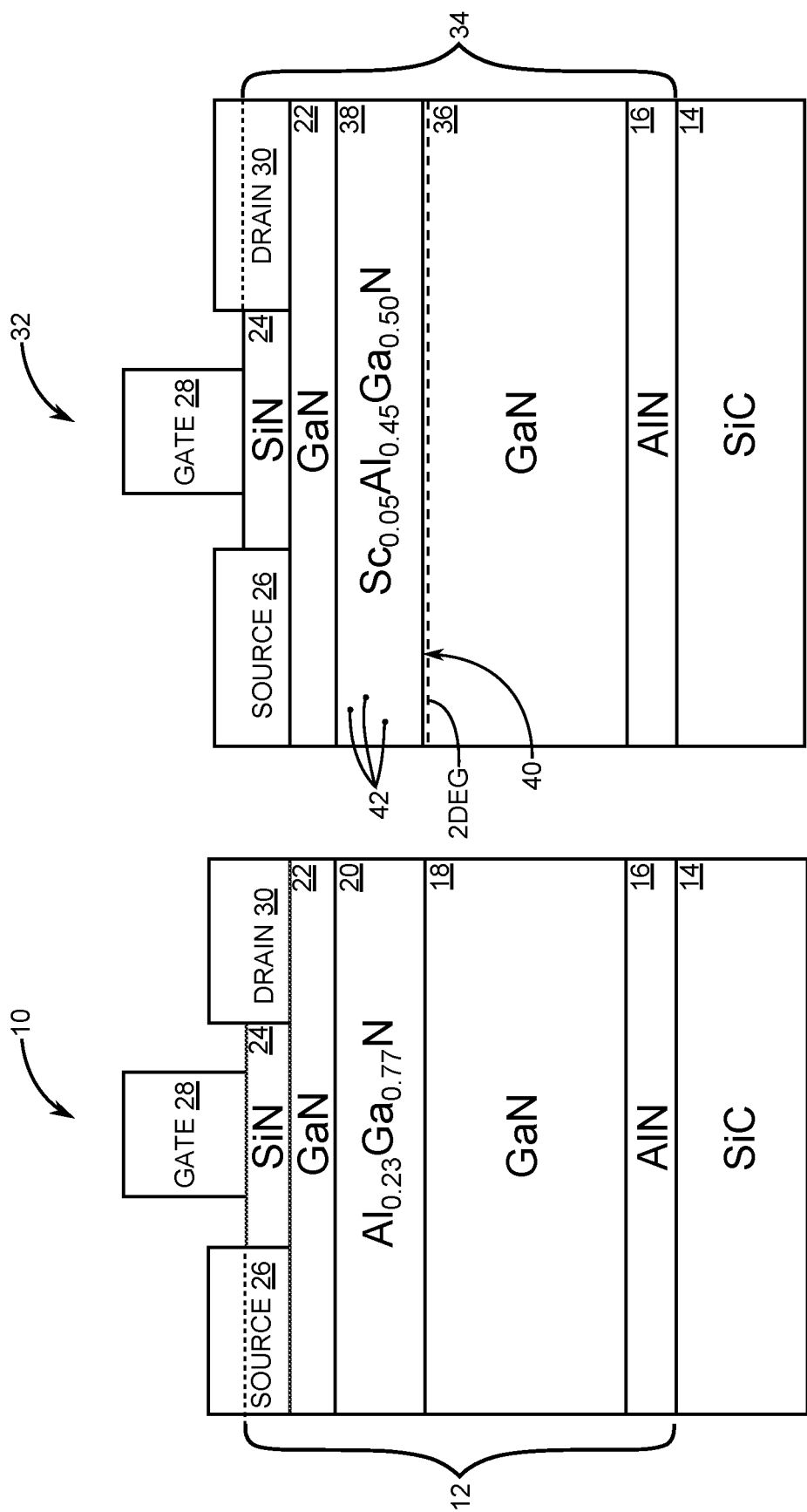

US 10,734,512 B2

HIGH ELECTRON MOBILITY TRANSISTOR (HEMT) DEVICE

RELATED APPLICATIONS

This application is a continuation-in-part of U.S. patent application Ser. No. 15/299,571, filed Oct. 21, 2016, now U.S. Pat. No. 10,636,881, which claims the benefit of provisional patent application Ser. No. 62/320,910, filed Apr. 11, 2016, the disclosures of which are hereby incorporated herein by reference in their entireties.

FIELD OF THE DISCLOSURE

The present disclosure relates to a high electron mobility (HEMT) device and, in particular, to reducing lattice stress between semiconductor layers while maintaining a high sheet charge density within the HEMT device.

BACKGROUND

In order to manufacture reliable gallium nitride (GaN) based high electron mobility transistor (HEMT) devices and circuits, the amount of residual stress in a device's epitaxial structure must be controlled such that the effects of inverse piezoelectric stresses and/or stress enhanced corrosion of barrier layers is mitigated. Several methods of stress control have been investigated. Some of these methods include replacing barrier layers with indium aluminum nitride (InAlN) or indium gallium aluminum nitride (InGaAlN) lattice matched alloys. Other methods focus on lattice engineering the buffer layer with low aluminum concentration aluminum gallium nitride (AlGaN), AlGaN/GaN superlattices or dilute boron gallium nitride (BGaN) alloys. However, such approaches in reducing lattice stress have certain limitations.

Another issue pertains to maintaining high sheet charge density within a HEMT device while providing lattice stress relief. The high sheet charge density and high breakdown field of GaN based field effect transistors (FETs) enables significantly higher power operation compared to traditional group III-V HFETs. Commercially available GaN FETs have a sheet charge density $<1 \times 10^{13}$ cm$^{-2}$. However, the highest charge density available for a GaN based materials system is greater than $5 \times 10^{13}$ cm$^{-2}$, which has been demonstrated with an AlN/GaN HFET. In such a system, the AlN is fully strained. However, the AlN barrier layer can readily form micro cracks if the thickness of the AlN barrier layer is beyond the critical thickness for lattice relaxation. In fact, even with an AlN thickness of approximately 4 nm, micro cracks would develop over time. Though the high sheet charge in an AlN/GaN system is attractive, the limitation of the strain makes a FET or HEMT device application impractical. To reduce strain energy, the thickness of the AlN barrier layer is reduced, which in turn dramatically reduces the sheet charge density. As such, an AlN system is far less attractive in comparison to a conventional AlGaN/GaN system.

One approach to minimizing total strain is the use of a lattice matched InAlN/GaN system. The sheet charge in a lattice matched condition is approximately $2.6 \times 10^{13}$ cm$^{-2}$. However, the poor crystal quality of InAlN, due mainly to phase segregation, limits applications for FETs and HEMTs. Furthermore, in addition to a very narrow growth window for closely lattice matched InAlN/GaN, sheet charge density decreases dramatically when the barrier is slightly compressively strained. As such, a need remains for providing lattice stress relief while maintaining high sheet charge density within a HEMT device.

SUMMARY

A high electron mobility transistor (HEMT) device with epitaxial layers that include a gallium nitride (GaN) layer and an aluminum (Al) based layer having an interface with the GaN layer is disclosed. The Al based layer includes Al and an alloying element that is selected from Group IIIB transition metals of the periodic table of elements. The epitaxial layers are disposed over the substrate. A gate contact, a drain contact, and a source contact are disposed on a surface of the epitaxial layers such that the source contact and the drain contact are spaced apart from the gate contact and each other. The alloying element relieves lattice stress between the GaN layer and the Al based layer while maintaining a high sheet charge density within the HEMT device. Further still, a HEMT device with epitaxial layers that provide an electron Hall mobility of 1080±5% centimeters squared per volt-second (cm$^2$/V·s) at room temperature for a charge density of $3.18 \times 10^{13}$/cm$^2$ and method of making the HEMT device are disclosed. The epitaxial layers include a channel layer made of GaN, a first spacer layer made of aluminum nitride (AlN) that resides over the channel layer, a first spacer layer made of Al$_x$Ga$_{(1-x)}$N that resides over the first spacer layer, and a first barrier layer made of Sc$_y$Al$_z$Ga$_{(1-y-z)}$N that resides over the second spacer layer. In at least one embodiment, a second barrier layer made of Al$_x$Ga$_{(1-x)}$N is disposed over the first barrier layer.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

FIG. 1 is a cross-sectional diagram of a prior art gallium nitride (GaN) high electron mobility transistor (HEMT) that can benefit from the teachings of the present disclosure.

FIG. 2 is a cross-sectional diagram of a GaN HEMT of the present disclosure.

DETAILED DESCRIPTION

Figure 3:
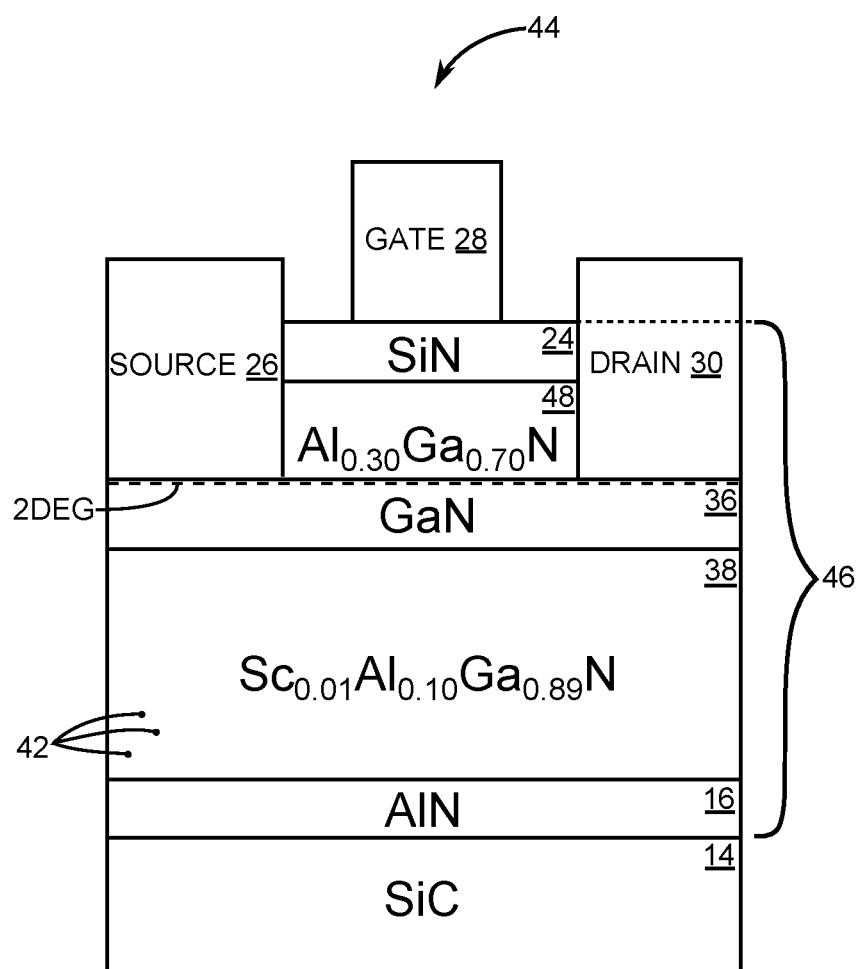
FIG. 3 is a cross-sectional diagram of a double heterostructure GaN HEMT of the present disclosure.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein. For this disclosure room temperature is defined to be between 20° C. and 25° C.

FIG. 1 is a cross-sectional diagram of a prior art gallium nitride (GaN) high electron mobility transistor (HEMT) 10 that can benefit from the teachings of the present disclosure. The prior art GaN HEMT 10 has epitaxial layers 12 formed over a substrate 14. In this exemplary case, the substrate 14 is made of silicon carbide (SiC). Other substrate materials such as sapphire and silicon are also available. The epitaxial layers 12 include a nucleation layer 16 made of aluminum nitride (AlN), a buffer layer 18 made of GaN, a barrier layer 20 made of AlGaN, a cap layer 22 made of GaN, and an optional passivation layer 24 made of silicon nitride (SiN). A source contact 26, a gate contact 28, and a drain contact 30 are disposed on a surface of the epitaxial layers 12. The buffer layer 18 is approximately 2 μm thick, and the barrier layer 20 is 10 to 30 nm thick.

FIG. 2 is a cross-sectional diagram of a GaN based HEMT device 32 of the present disclosure. The present disclosure provides lattice stress relief while maintaining high sheet charge density within the HEMT device 32. Generally, the HEMT device 32 has epitaxial layers 34 that include a GaN layer 36 that is equivalent to the buffer layer 18 depicted in FIG. 1. Also included is an aluminum (Al) based layer 38 having an interface 40 with the GaN layer 36. In this case the Al based layer 38 serves the same function as the barrier layer 20 depicted in FIG. 1. The Al based layer 38 comprises Al and an alloying element 42 that is selected from Group IIIB transition metals of the periodic table of elements. In an exemplary embodiment, the alloying element 42 is scandium (Sc), which is used to form scandium aluminum gallium nitride (ScAlGaN).

An Sc concentration of 18% in $Sc_xAl_{(1-x)}$ is predicted to be a lattice match for GaN. However, a concentration in the range of 1% to 5% of the alloying element 42 within the Al based layer 38 provides a relatively higher sheet charge density while providing the same reliability as modern HEMT devices. In other embodiments, the concentration of the alloying element in a buffer layer such as Al based layer 38 is in the range of 0.5% to 5%. Some modern HEMT devices include an AlGaN barrier layer having up to 23% Al with a 20 nm thickness. A much higher sheet charge density could be achieved by increasing the concentration of Al to 50% while maintaining the 20 nm thickness. However, increasing the Al concentration to 50% would reduce the reliability of such a HEMT device to an impractical level. In contrast, the present disclosure's addition of Sc as the alloying element at a 5% concentration within the Al based layer 38 provides a sheet charge density of $2.2 \times 10^{13}$ cm$^{-2}$, which is practically the same sheet charge density expected by increasing the Al to 50%. In the embodiment of FIG. 2, the Al based layer 38 is made of $Sc_{0.05}Al_{0.45}Ga_{0.50}N$. A two-dimensional electron gas (2DEG) having the sheet charge density of $2.2 \times 10^{13}$ cm$^{-2}$ is formed at the interface 40.

It is to be understood that other alloying elements and thicknesses for the Al based layer 38 are available depending on the performance goals for the HEMT device 32. For example, other alloying elements such as yttrium (Y) having an oxidation state of +3 are available. In some embodiments, the yttrium is in the form of yttrium aluminum nitride (YAlN) or yttrium aluminum gallium nitride (YAlGaN).

FIG. 3 is a cross-sectional diagram of a double heterostructure GaN HEMT 44 having epitaxial layers 46 of the present disclosure. In this embodiment, Sc is employed as the alloying element 42 with a concentration of in the range of 1% to 5% within the Al based layer 38 for use as a buffer and/or a back barrier layer. The lattice constant for the Al based layer 38 used as a buffer layer is adjustable during manufacture to increase Al concentration without sacrificing reliability. As such, in this particular embodiment, the Al based layer 38 has increased Al content that makes the Al based layer 38 particularly attractive for forming the double heterostructure HEMT device 44 that further includes an aluminum gallium (AlGaN) layer 48 that is over the GaN layer 36. The double heterostructure nature of the double heterostructure HEMT device 44 improves carrier confinement to reduce short channel effects in scaled devices.

Figure 4:
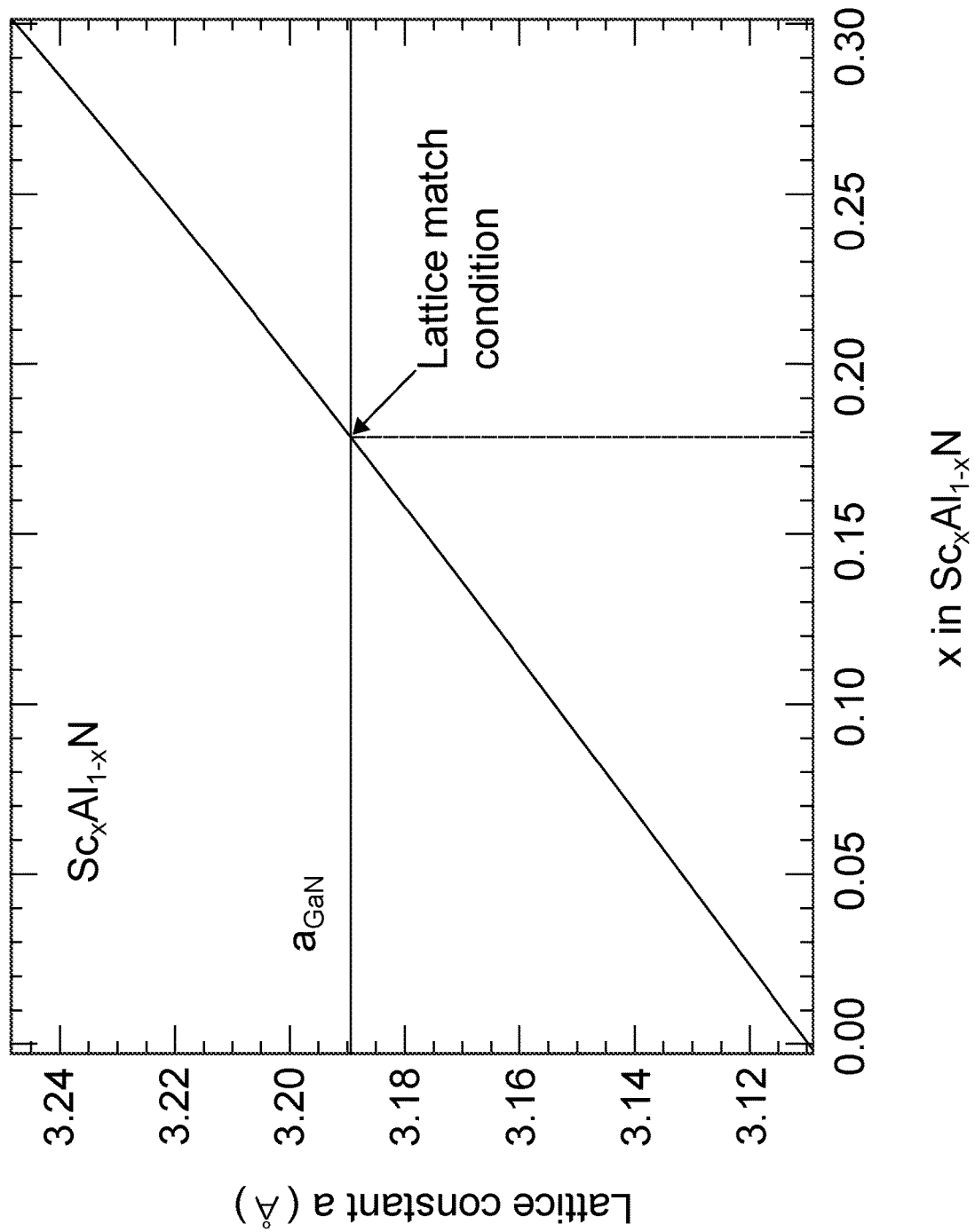
FIG. 4 is a graph of calculated in plane lattice constant of scandium aluminum nitride (Sc$_x$Al$_{1-x}$N) as a function of Sc concentration in solid phase.

FIG. 4 is a graph of calculated in plane lattice constant (a) of scandium aluminum nitride (ScAlN) as a function of Sc concentration in solid phase. The graph shows a lattice match condition between ScAlN and GaN when the concentration of Sc is approximately 18%. For the purpose of this disclosure a lattice match condition is defined as being within 1% of the lattice constant of GaN. Therefore, the concentration of Sc is in the range of 17% to 19% to achieve a lattice match with GaN. In other embodiments, the alloying element 42 has a concentration within the Al based layer that is between 5% and 17%.

In some embodiments, ScAlN/GaN and ScAlGaN/GaN interfaces are lattice matched by adding an appropriate concentration of an alloying element to an Al based layer, which in this example is either ScAlN/GaN or ScAlGaN/GaN. ScAlN is attractive for lattice matching because ScAlN is relatively easy to deposit, and ScAlN exhibits no phase segregation up to an Sc concentration of 30%. Moreover, ScAlN and ScAlGaN matched lattices allow HEMT devices fabricated in accordance with the present disclosure to have sheet charge densities set by varying alloy compositions. For example, a lattice matched $Sc_{0.18}Al_{0.72}N$/GaN has a calculated sheet charge density that is about $5.1 \times 10^{13}$ $cm^{-2}$, which is only a fraction less than an AlN/GaN heterojunction structure. It is also observed that sheet charge density only decreases by 2% for Sc concentrations that are greater than 18% when the lattice is within 1% of being matched.

Figure 5:
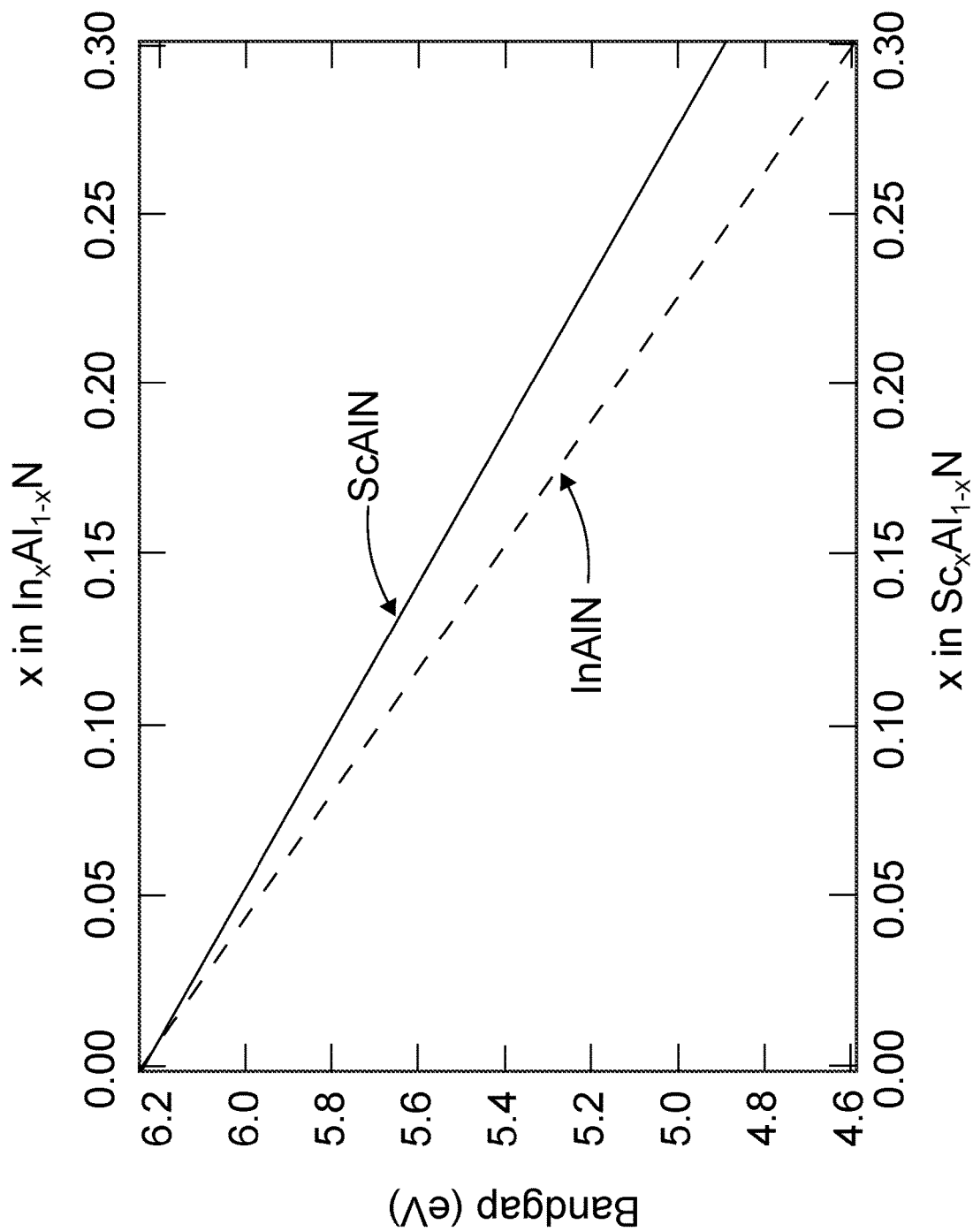
FIG. 5 is a graph comparing the bandgap of indium aluminum nitride (InAlN) and scandium aluminum nitride (ScAlN) as a function of Sc and In concentrations.

FIG. 5 is a graph comparing the bandgap of indium aluminum nitride (InAlN) and scandium aluminum nitride (ScAlN) as a function of Sc and In concentrations. Note that for a lattice match condition, ScAlN has a larger bandgap compared to the bandgap of indium aluminum nitride (InAlN).

Figures 6, 7:
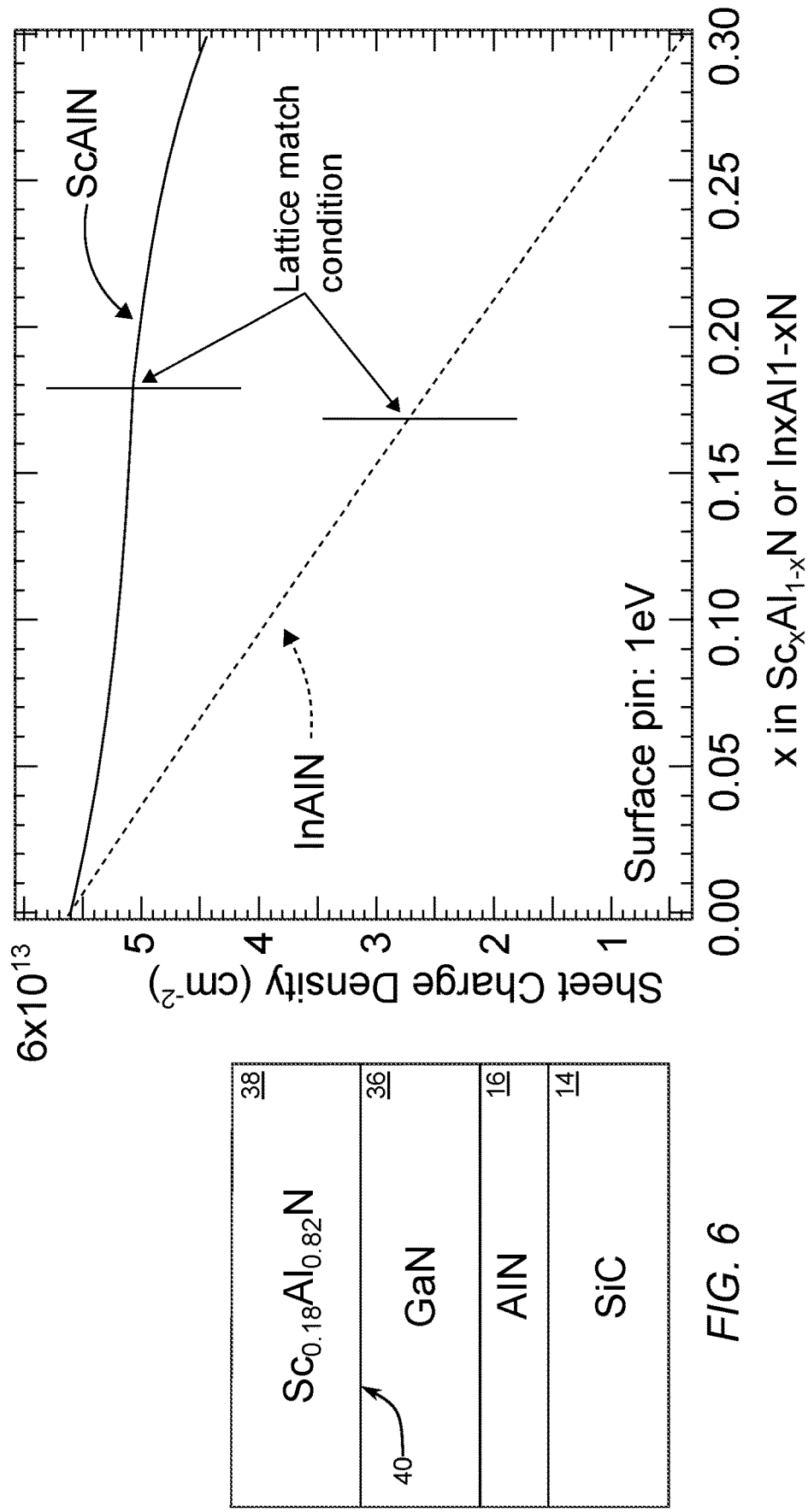
FIG. 6 is a cross-sectional diagram of a ScAlN/GaN structure.
FIG. 7 is a graph comparing calculated sheet charge density as a function of Sc and In concentrations.

FIG. 6 is a cross-sectional diagram of a ScAlN/GaN structure. In this exemplary embodiment, the interface 40 is lattice matched using ScAlN/GaN, and FIG. 7 is a graph comparing calculated sheet charge density as a function of Sc and In concentrations. The graph of FIG. 7 depicts the lattice match condition for each of the alloying compositions ScAlN/GaN and InAlN. Notice that a lattice matched ScAlN/GaN HEMT device has a sheet charge density of $5.1 \times 10^{13}$ $cm^{-2}$, which is close to $5.6 \times 10^{13}$ $cm^{-2}$ maximum for a lattice matched InAlN/GaN HEMT device. In other embodiments, a sheet charge on the order of $2.0 \times 10^{13}$ $cm^{-2}$ is useful for high breakdown voltage devices.

Figure 8:
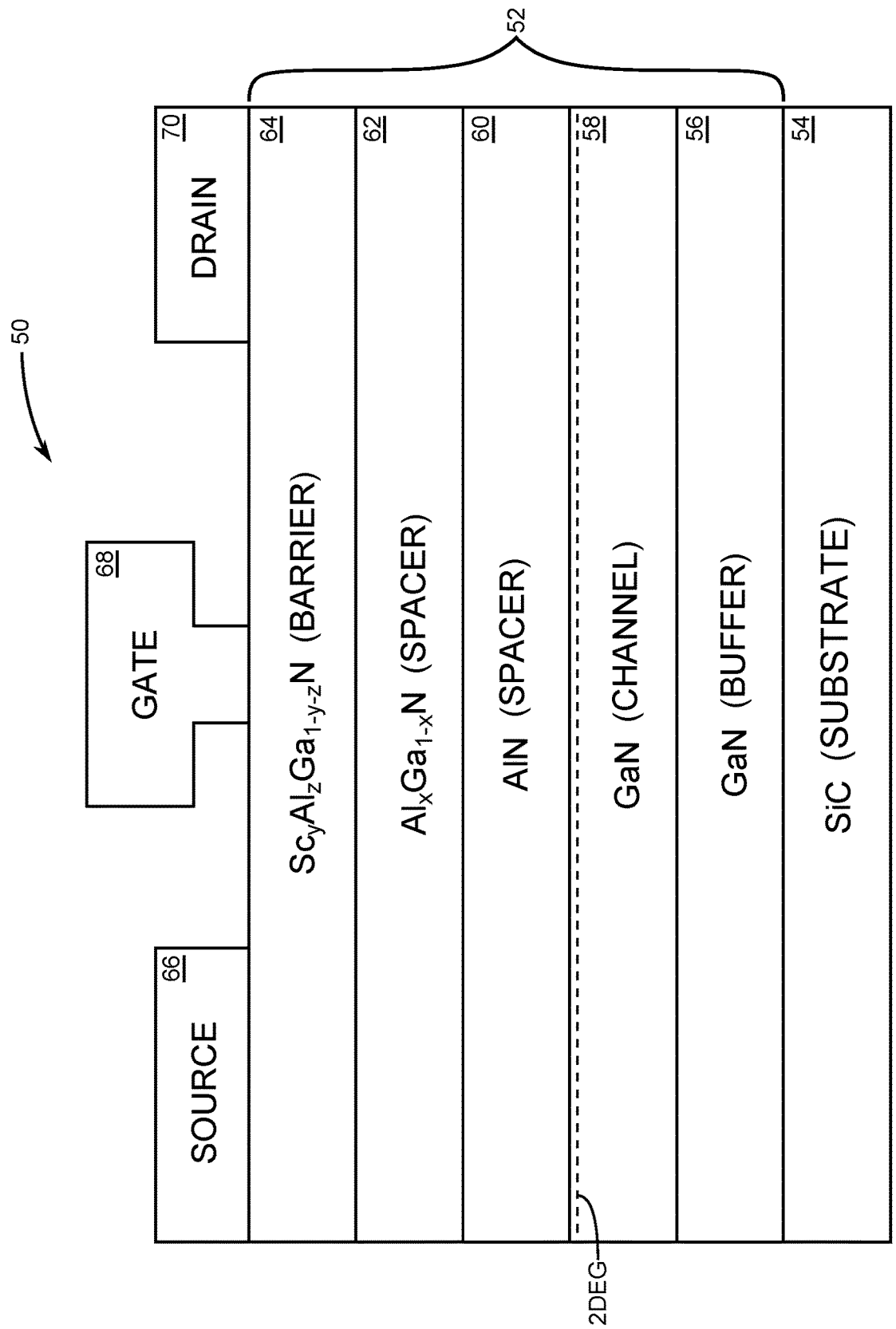
FIG. 8 is a cross-sectional diagram of a GaN HEMT having improved electron Hall mobility in accordance with the present disclosure.

FIG. 8 is a cross-sectional diagram of a GaN HEMT device 50 having improved electron Hall mobility in accordance with the present disclosure. The GaN HEMT device 50 has epitaxial layers 52 formed over a substrate 54. In this exemplary case, the substrate 54 is made of silicon carbide (SiC). Other substrate materials such as sapphire, silicon, and thermally conductive polymers are also available. The epitaxial layers 52 include a buffer layer 56 made of GaN, a channel layer 58 made of GaN, a first spacer layer 60 made of AlN, a second spacer layer 62 made of $Al_xGa_{(1-x)}N$ (0<x<0.5), and a barrier layer 64 made of $Sc_yAl_zGa_{(1-y-z)}N$. A source contact 66, a gate contact 68, and a drain contact 70 are disposed on a surface of the epitaxial layers 52.

At least one advantage of combining the first spacer layer 60 made of AlN and the second spacer layer 62 made of $Al_xGa_{(1-x)}N$ is that the electron Hall mobility is improved from about 800 centimeters squared per volt-second ($cm^2$/V·s) at room temperature for the previous embodiments to 1080 $cm^2$/V·s ±5% at room temperature for the embodiment of FIG. 8 for the same charge density of $3.18 \times 10^{13}$/$cm^2$. This relatively greatly improved electron Hall mobility provides a sheet resistance within the channel layer 58 of no more than 195 Ohms/square.

Another advantage of disposing the first spacer layer 60 made of AlN between the channel layer 58 made of GaN and the second spacer layer 62 made of $Al_xGa_{(1-x)}N$ is that disposing the binary material AlN adjacent to the channel layer 58 made of GaN reduces carrier scattering relative to the ternary material $Al_xGa_{(1-x)}N$ that makes up the second spacer layer 62. In this embodiment the carrier is electrons, and in at least some embodiments the first spacer layer 60 made of AlN is disposed directly onto the channel layer 58 with no intervening layers.

Thicknesses of the first spacer layer 60 and the second spacer layer 62 also contribute to improved performance of the GaN HEMT 50. In the embodiment of FIG. 8, the thickness of the first spacer layer 60 is between 5 Angstroms (Å) and 15 Å, and the thickness of the second spacer layer is between 10 Å and 50 Å. The thickness of the first spacer layer 60 is limited by strain on the AlN material, so the second spacer layer 62 requires a relatively increased thickness to protect the AlN from oxidation. The combined thickness of the first spacer layer 60 and the second spacer layer 62 is large enough to prevent carrier scattering from the barrier layer 64 made of $Sc_yAl_zGa_{(1-y-z)}N$. A thickness of the barrier layer 64 made of $Sc_yAl_zGa_{(1-y-z)}N$ is between 30 Å and 300 Å.

Figure 9:
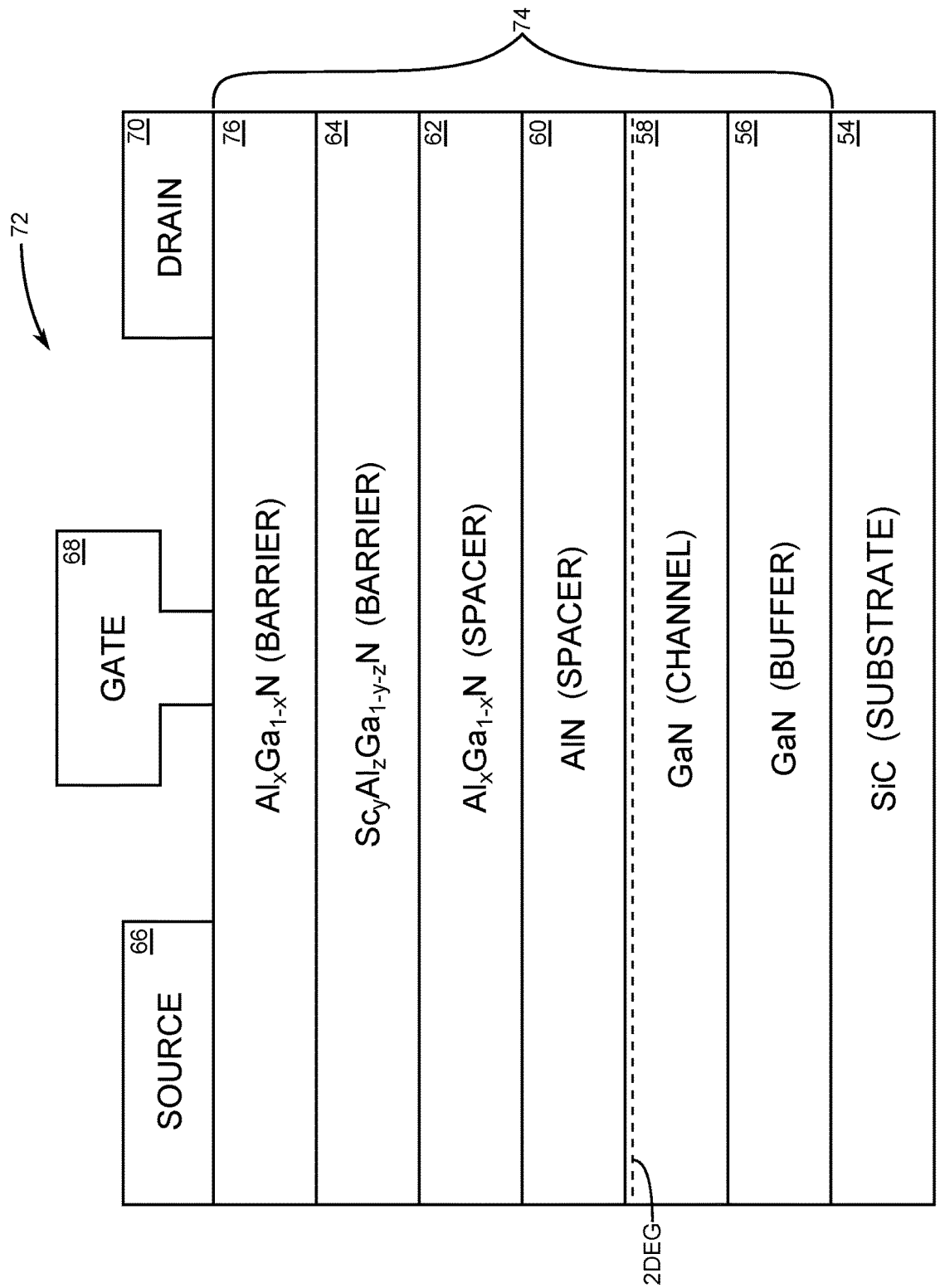
FIG. 9 is a cross-sectional diagram of a GaN HEMT having improved electron Hall mobility and improved breakdown and/or reliability in accordance with the present disclosure.

FIG. 9 is a cross-sectional diagram of a GaN HEMT device 72 having improved electron Hall mobility and improved breakdown and/or reliability in accordance with the present disclosure. The GaN HEMT device 72 has epitaxial layers 74 formed over a substrate 54. A difference between the epitaxial layers 74 and the epitaxial layers 52 of the previous embodiment of FIG. 8 is an addition of a second barrier layer 76 made of $Al_xGa_{(1-x)}N$ (0<x<0.5). In other embodiments, a cap layer such cap layer 22 of FIG. 2 can be disposed over the second barrier layer 76. In other embodiments, the barrier layer 64 made of $Sc_yAl_zGa_{(1-y-z)}N$ is interchanged in position within the epitaxial layers 74 with the second barrier lay 76 made of $Al_xGa_{(1-x)}N$, so that the second barrier layer 76 is adjacent to the second spacer layer 62.

Those skilled in the art will recognize improvements and modifications to the preferred embodiments of the present disclosure. All such improvements and modifications are considered within the scope of the concepts disclosed herein and the claims that follow.

What is claimed is:

1. A high electron mobility transistor (HEMT) device comprising:
   a substrate;
   epitaxial layers over the substrate and comprising;
   a channel layer made of gallium nitride (GaN);
   a first spacer layer made of aluminum nitride (AlN) that resides over the channel layer;
   a second spacer layer made of $Al_xGa_{(1-x)}N$ that resides over the first spacer layer; and
   a first barrier layer made of $Sc_yAl_zGa_{(1-y-z)}N$ that resides over the second spacer layer, wherein y is at least 0.005; and
   a gate contact disposed on a surface of the epitaxial layers;
   a source contact disposed on the surface of the epitaxial layers; and
   a drain contact disposed on the surface of the epitaxial layers, wherein the source contact and the drain contact are spaced apart from the gate contact and each other.

2. The HEMT device of claim 1 having an electron Hall mobility of 1080±5% centimeters squared per volt-second ($cm^2/V \cdot s$) at room temperature for a charge density of $3.18 \times 10^{13}/cm^2$.

3. The HEMT device of claim 2 wherein a sheet resistance within the channel layer is no more than 195 Ohms/square.

4. The HEMT device of claim 1 wherein the first spacer layer has a thickness between 5 Angstoms (Å) and 15 Å.

5. The HEMT device of claim 1 wherein the second spacer layer has a thickness between 10 Å and 50 Å.

6. The HEMT device of claim 1 wherein the first spacer layer has a thickness between 5 Å and 15 Å, and the second spacer layer has a thickness between 10 Å and 50 Å.

7. The HEMT device of claim 5 wherein a combined thickness of the first spacer layer and the second spacer layer prevents carrier scattering from the first barrier layer made of $Sc_yAl_zGa_{(1-y-z)}N$.

8. The HEMT device of claim 1 wherein the a first barrier layer made of $Sc_yAl_zGa_{(1-y-z)}N$ is between 30 Å and 300 Å thick and wherein y is between 0.005 and 0.3.

9. The HEMT device of claim 1 further including a second barrier layer, wherein the second barrier layer is made of $Al_xGa_{(1-x)}N$ resides over the first barrier layer and is between 10 Å and 100 Å thick.

10. The HEMT device of claim 1 further including a buffer layer made of GaN that resides between the substrate and the channel layer.

11. A method of making a HEMT device comprising:
    providing a substrate;
    disposing over the substrate, epitaxial layers comprising;
    a channel layer made of gallium nitride (GaN);
    a first spacer layer made of aluminum nitride (AlN) that resides over the channel layer;
    a second spacer layer made of $Al_xGa_{(1-x)}N$ that resides over the first spacer layer; and
    a first barrier layer made of $Sc_yAl_zGa_{(1-y-z)}N$ that resides over the second spacer layer, wherein y is at least 0.005; and
    disposing a gate contact on a surface of the epitaxial layers;
    disposing a source contact on the surface of the epitaxial layers; and
    disposing a drain contact on the surface of the epitaxial layers, wherein the source contact and the drain contact are spaced apart from the gate contact and each other.

12. The method of making a HEMT device of claim 11 wherein the HEMT device has an electron Hall mobility of 1080±5% centimeters squared per volt-second ($cm^2/V \cdot s$) at room temperature for a charge density of $3.18 \times 10^{13}/cm^2$.

13. The method of making the HEMT device of claim 12 wherein a sheet resistance within the channel layer is no more than 195 Ohms/square.

14. The method of making the HEMT device of claim 11 wherein the first spacer layer has a thickness between 5 Å and 15 Å.

15. The method of making the HEMT device of claim 11 wherein the second spacer layer has a thickness between 10 Å and 50 Å.

16. The method of making the HEMT device of claim 11 wherein the first spacer layer has a thickness between 5 Å and 15 Å, and the second spacer layer has a thickness between 10 Å and 50 Å.

17. The method of making the HEMT device of claim 15 wherein a combined thickness of the first spacer layer and the second spacer layer prevents carrier scattering from the first barrier layer made of $Sc_yAl_zGa_{(1-y-z)}N$.

18. The method of making the HEMT device of claim 11 wherein the a first barrier layer made of $Sc_yAl_zGa_{(1-y-z)}N$ is between 30 Å and 300 Å thick and wherein y is between 0.005 and 0.3.

19. The method of making the HEMT device of claim 11 further including disposing a second barrier layer over the first barrier layer, wherein the second barrier layer is made of $Al_xGa_{(1-x)}N$ that is between 10 Å and 100 Å thick.

20. The method of making the HEMT device of claim 11 further including disposing a buffer layer made of GaN over the substrate before disposing the channel layer.

* * * * *